United States Patent
Kong et al.

(10) Patent No.: US 12,191,856 B2
(45) Date of Patent: Jan. 7, 2025

(54) INPUT BUFFER CIRCUIT AND SEMICONDUCTOR SYSTEM INCLUDING THE SAME

(71) Applicant: SK hynix Inc., Icheon-si (KR)

(72) Inventors: In Seok Kong, Icheon-si (KR); Jae Hyeong Hong, Icheon-si (KR); Min Su Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 183 days.

(21) Appl. No.: 18/107,934

(22) Filed: Feb. 9, 2023

(65) Prior Publication Data

US 2024/0007108 A1    Jan. 4, 2024

(30) Foreign Application Priority Data

Jun. 29, 2022 (KR) .......................... 10-2022-0079733

(51) Int. Cl.
*H03K 19/0185* (2006.01)
*H03K 19/003* (2006.01)

(52) U.S. Cl.
CPC .............. *H03K 19/018521* (2013.01); *H03K 19/00384* (2013.01)

(58) Field of Classification Search
CPC .................. H03K 19/00384; H03K 19/018521
See application file for complete search history.

(56) References Cited

U.S. PATENT DOCUMENTS

| | | | | |
|---|---|---|---|---|
| 2006/0220689 | A1* | 10/2006 | Kang | H03K 5/2481 327/77 |
| 2010/0039142 | A1* | 2/2010 | Lee | H03K 5/153 327/77 |
| 2015/0263711 | A1* | 9/2015 | Lee | H03K 5/2481 327/306 |
| 2017/0117893 | A1* | 4/2017 | Ahn | H03K 19/018521 |
| 2023/0017747 | A1* | 1/2023 | Li | G11C 11/4093 |

FOREIGN PATENT DOCUMENTS

| KR | 100670683 B1 | 1/2007 |
|---|---|---|
| KR | 1020170048988 A | 5/2017 |

* cited by examiner

*Primary Examiner* — Patrick O Neill
(74) *Attorney, Agent, or Firm* — WILLIAM PARK & ASSOCIATES LTD.

(57) ABSTRACT

An input buffer circuit includes a signal input circuit and a linear setting circuit. The signal input circuit is configured to receive an input signal to generate an output signal based on a reference voltage and an activation current. The linear setting circuit is configured to compare a voltage of a first modeling node, which may correspond to the input signal, with a voltage of a second modeling node, which may correspond to the reference voltage, to generate a bias voltage for controlling the activation voltage.

16 Claims, 5 Drawing Sheets

INPUT BUFFER CIRCUIT AND SEMICONDUCTOR SYSTEM INCLUDING THE SAME

CROSS-REFERENCES TO RELATED APPLICATION

The present patent application claims priority under 35 U.S.C. § 119(a) to Korean patent application number 10-2022-0079733, filed on Jun. 29, 2022, in the Korean Intellectual Property Office, which is incorporated herein by reference in its entirety.

BACKGROUND

1, Technical Field

Various disclosures generally relate to an input buffer circuit and a semiconductor system including the same, and more particularly, to an input buffer circuit configured to generate an output signal having a linear characteristic with respect to an input signal and a semiconductor system including the input buffer circuit.

2, Related Art

Generally, a semiconductor device may receive a signal to perform a desired operation. The semiconductor device may include an input buffer circuit configured to receive the signal. The input buffer circuit may buffer the signal to generate an output signal. The input buffer circuit may provide various internal circuits with the output signal. Thus, to input the signal into the internal circuits, it may be required to perform a desired buffering operation by the input buffer circuit.

The input signal inputted into the input buffer circuit may have a linear characteristic. The output signal from the input buffer circuit may also have a linear characteristic. However, to maintain the linear characteristics of the output signal, it may be difficult to accurately control resistance values of circuits in the input buffer circuit.

Recently, to overcome low operational reliability due to signal attenuation, a semiconductor device may include an equalization circuit. The equalization circuit may include a decision feedback equalization (DFE) circuit. To perform an optimal equalization operation, it may be required to provide the DFE circuit with a signal having the linear characteristic, Thus, the semiconductor device with the equalization circuit such as the DFE circuit may include the input buffer circuit configured to provide the signal having the linear characteristic.

SUMMARY

In accordance with an embodiment is an input buffer circuit. The input buffer circuit may include a signal input circuit and a linear setting circuit. The signal input circuit is configured to receive an input signal to generate an output signal based on a reference voltage and an activation current. The linear setting circuit is configured to compare a voltage of a first modeling node, which may correspond to the input signal, with a voltage of a second modeling node, which may correspond to the reference voltage, to generate a bias voltage for controlling the activation voltage.

In accordance with an embodiment is a semiconductor system. The semiconductor system may include a transmission circuit and an input buffer circuit. The transmission circuit is configured to provide an input signal reflecting an on-resistance and on-resistance information corresponding to the on-resistance. The input buffer circuit may include a signal input circuit and a linear setting circuit. The signal input circuit is configured to receive the input signal to generate an output signal based on a reference voltage and an activation current. The linear setting circuit is configured to compare a voltage of a first modeling node, which may correspond to the input signal, with a voltage of a second modeling node, which may correspond to the reference voltage, to generate a bias voltage for controlling the activation voltage. The input buffer circuit may set the bias voltage based on the on-resistance information.

According to an embodiment, the input buffer circuit may generate the output signal having the linear characteristic to improve operational reliability with respect to an internal circuit of a next terminal after a terminal configured to receive the output signal.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected, Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the possibility of additional embodiments. Although a few embodiments of the present teachings will be shown and described, it will be appreciated by those of ordinary skill in the art that changes may be made in these embodiments without departing from the principles and spirit of the present teachings, FIG. 1 is a block diagram illustrating an input buffer circuit in accordance with example embodiments.

Figure 1:
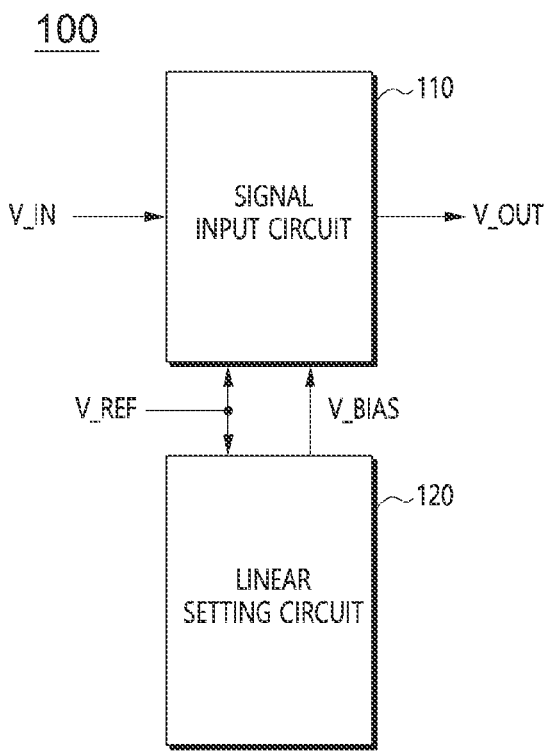
FIG. 1 is a block diagram illustrating an input buffer circuit in accordance with an embodiment.

Referring to FIG. 1, an input buffer circuit 100 may buffer an input signal V_IN to generate an output signal V_OUT having a linear characteristic. The input buffer circuit 100 may include a signal input circuit 110 and a linear setting circuit 120.

The signal input circuit 110 may receive the input signal V_IN to generate the output signal V_OUT based on a reference voltage V_REF and an activation current (not shown in FIG. 1), The signal input circuit 110 is illustrated later in detail with reference to FIGS. 2, 3, and 7.

The linear setting circuit 120 may be configured to generate a bias voltage V_BIAS for controlling the activation current. The linear setting circuit 120 may include a first modeling node and a second modeling node. The first modeling node may correspond to the input signal V_IN. The second modeling node may correspond to the reference voltage V_REF. The linear setting circuit 120 may compare voltages of the first and second modeling nodes with each other to generate the bias voltage V_BIAS. As indicated above, the bias voltage V_BIAS may control the activation current generated in the signal input circuit 110.

According to an embodiment, the input buffer circuit 100 may compare the voltage of the first and second modeling nodes corresponding to the reference voltage V_REF and the input signal V_IN, respectively, with each other to control the activation current of the signal input circuit 110. Thus, the signal input circuit 110 may output the output signal V_OUT having the linear characteristic with respect to the input signal V_IN by the controlled activation current.

Figure 2:
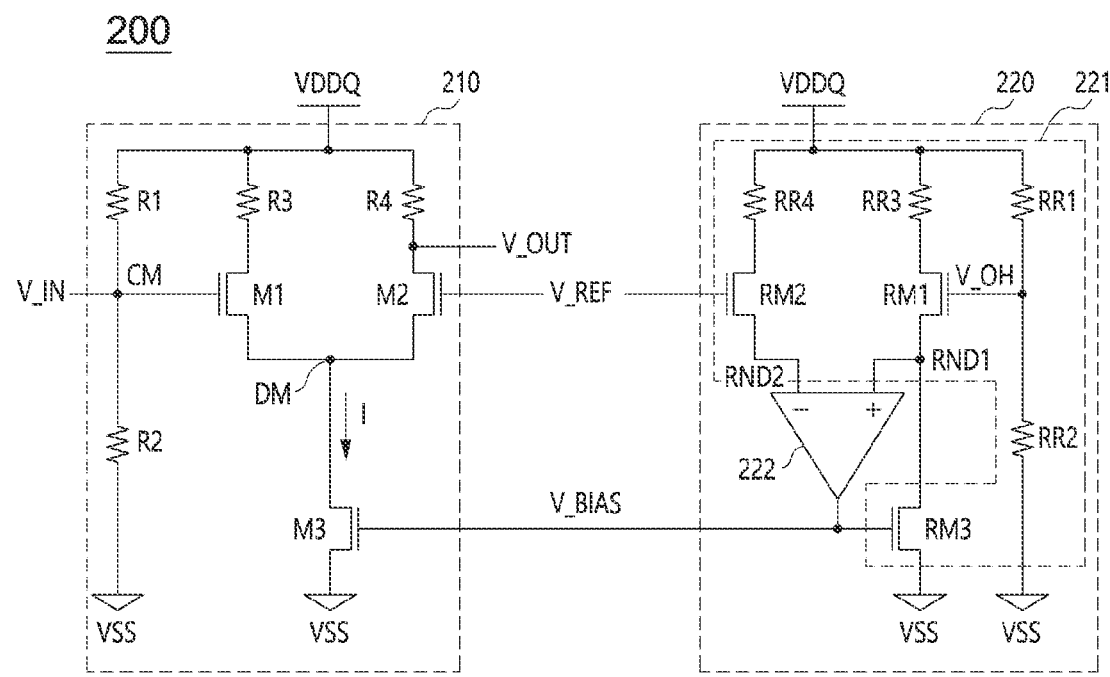
FIG. 2 is a circuit diagram illustrating an input buffer circuit in accordance with an embodiment.

FIG. 2 is a circuit diagram illustrating an input buffer circuit in accordance with an embodiment.

Referring to FIG. 2, an input buffer circuit 200 may include a signal input circuit 210 and a linear setting circuit 220.

The signal input circuit 10 may receive the input signal V_IN to generate the output signal V_OUT based on the reference voltage V_REF and the activation current I. The signal input circuit 210 may include first to fourth resistances R1, R2, R3, and R4 and first to third NMOS transistors M1, M2, and M3.

In an embodiment, the signal input circuit 210 may include the NMOS transistors as a circuit element. The signal input circuit 210 may include various circuit elements such as PMOS transistors as well as the NMOS transistors. A connection relation between the circuit elements and phase of a signal inputted into the circuit elements may be changed in accordance with the kinds of circuit elements.

The first and second resistances R1 and R2 may be serially connected between a supply power voltage terminal VDDQ and a ground power voltage terminal VSS. A common node CM between the first resistance R1 and the second resistance R2 may be connected to a pad configured to receive the input signal V_IN. The third resistance R3 and the first NMOS transistor M1 may be serially connected between the supply power voltage terminal VDDQ and a drive node DM. A gate of the first NMOS transistor M1 may receive the input signal V_IN. The fourth resistance R4 and the second NMOS transistor M2 may be serially connected between the supply power voltage terminal VDDQ and the drive node DM. A gate of the second NMOS transistor M2 may receive the reference voltage V_REF. The output signal V_OUT may be outputted from a common node between the fourth resistance R4 and the second NMOS transistor M2. The third NMOS transistor M3 may be connected between the drive node DM and the ground power voltage terminal VSS. A gate of the third NMOS transistor M3 may receive the bias voltage V_BIAS.

The signal input circuit 210 may buffer the input signal based on the reference voltage V_REF. The activation current I may be formed in the third NMOS transistor M3 of the signal input circuit 210. The activation current I may be controlled based on the bias voltage V_BIAS. Thus, the signal input circuit 210 may receive the input signal V_IN to generate the output signal V_OUT based on the reference voltage V_REF and the activation current I.

The linear setting circuit 220 may generate the bias voltage V_BIAS for controlling the activation current I. The linear setting circuit 220 may compare a voltage of a first modeling node RND1, which may correspond to a gate voltage V_OH modeling the input signal V_IN, with a voltage of a second modeling node RND2, which may correspond to the reference voltage V_REF, to generate the bias voltage V_BIAS, The linear setting circuit 220 may include an input modeling circuit 221 and a comparison circuit 222.

The input modeling circuit 221 may include the first modeling node RND1 and the second modeling node RND2 to model the signal input circuit 210. The input modeling circuit 221 may include first to fourth modeling resistances RR1, RR2, RR3, and RR4 and first to third modeling NMOS transistors RM1, RM2, and RM3.

The first and second modeling resistances RR1 and RR2 may be serially connected between the supply power voltage terminal VDDQ and the ground power voltage terminal VSS. The gate voltage V_OH on which a resistance value applied to the input signal V_IN may be reflected may be formed at a common node between the first modeling resistance RR1 and the second modeling resistance RR2. The first and second modeling resistances RR1 and RR2 may be formed by modeling the corresponding first and second resistances R1 and R2 of the signal input circuit 210, respectively.

The third modeling resistance RR3 and the first modeling NMOS transistor RM1 may be serially connected between the supply power voltage terminal VDDQ and the comparison circuit 222. A gate of the first modeling NMOS transistor RM1 may receive the gate voltage V_OH. The third modeling resistance RR3 and the first modeling NMOS transistor RM1 may be formed by modeling the corresponding third resistance R3 and the corresponding first NMOS transistor M1, respectively.

The fourth modeling resistance RR4 and the second modeling NMOS transistor RM2 may be serially connected between the supply power voltage terminal VDDQ and the comparison circuit 222, A gate of the second modeling NMOS transistor RM2 may receive the reference voltage V_REF. The fourth modeling resistance RR4 and the second modeling NMOS transistor RM2 may be formed by modeling the corresponding fourth resistance R4 and the corresponding second NMOS transistor M2 of the signal input circuit 210, respectively. The first modeling node RND1 may be formed at an input terminal (+) of the comparison circuit 222 connected with the first modeling NMOS transistor RM1, The second modeling node RND2 may be formed at an input terminal (−) of the comparison circuit 222 connected with the second modeling NMOS transistor RM2.

The third modeling NMOS transistor RM3 may be connected between the first modeling NMOS transistor RM1 and the ground power voltage terminal VSS, A gate of the third modeling NMOS transistor RM3 may receive the bias voltage V_BIAS generated from the comparison circuit 222. The third modeling NMOS transistor RM3 may be formed by modeling the corresponding third NMOS transistor M3 of the signal input circuit 210.

The comparison circuit 222 may compare the voltage of the first modeling node RND1 with the voltage of the second modeling node RND2 to generate the bias voltage V_BIAS.

Hereinafter, an operation of the linear setting circuit 220 is described in detail.

The comparison circuit 222 may compare the voltage of the first modeling node RND1 as a source of the first modeling NMOS transistor RM1 with the voltage of the second modeling node RND2 as a source of the second modeling NMOS transistor RM2, When the voltage of the first modeling node RND1 is higher than the voltage of the second modeling node RND2, the comparison circuit 222 may increase a voltage level of the bias voltage V_BIAS. In contrast, when the voltage of the second modeling node RND2 is higher than the voltage of the first modeling node RND1, the comparison circuit 222 may decrease the voltage level of the bias voltage V_BIAS.

The third modeling NMOS transistor RM3 may convert the voltage of the bias voltage V_BIAS into a current through the third modeling NMOS transistor RM3. Thus, an amount of the current flowing through the third modeling NMOS transistor RM3 may be increased in proportion to the increasing of the bias voltage V_BIAS. In contrast, the amount of the current flowing through the third modeling NMOS transistor RM3 may be decreased in proportion to the decreasing of the bias voltage V_BIAS.

The first modeling NMOS transistor RM1 may set the voltage of the first modeling node RND1 in accordance with the current flowing through the third modeling NMOS transistor RM3 and the gate voltage V_OH. When the current flowing through the third modeling NMOS transistor RM3 is increased, the voltage level of the first modeling node RND1 may be decreased. In contrast, when the current flowing through the third modeling NMOS transistor RM3 is decreased, the voltage level of the first modeling node RND1 may be increased.

Therefore, the linear setting circuit 220 may control to provide the first modeling node RND1 and the second modeling node RND2 with the same voltage. A saturation voltage of the first modeling NMOS transistor RM1 may be a value obtained by subtracting the reference voltage V_REF from the gate voltage V_OH. The bias voltage V_BIAS generated from the linear setting circuit 220 may control the activation current I of the signal input circuit 210. Thus, the first NMOS transistor M1 of the signal input circuit 210 may be driven by the saturation voltage corresponding to the first modeling NMOS transistor RM1. As a result, the signal input circuit 210 may be set to generate the output signal V_OUT having the linear characteristic with respect to the input signal V_IN.

According to an embodiment, the input buffer circuit 200 may generate the output signal V_OUT having the linear characteristic by the signal input circuit 210 and the linear setting circuit 220 formed by modeling the signal input circuit 210. Further, the input buffer circuit 200 may maintain the uniform linear characteristic by the modeling circuit regardless of changes of a process, a voltage, a temperature, etc.

Figure 3:
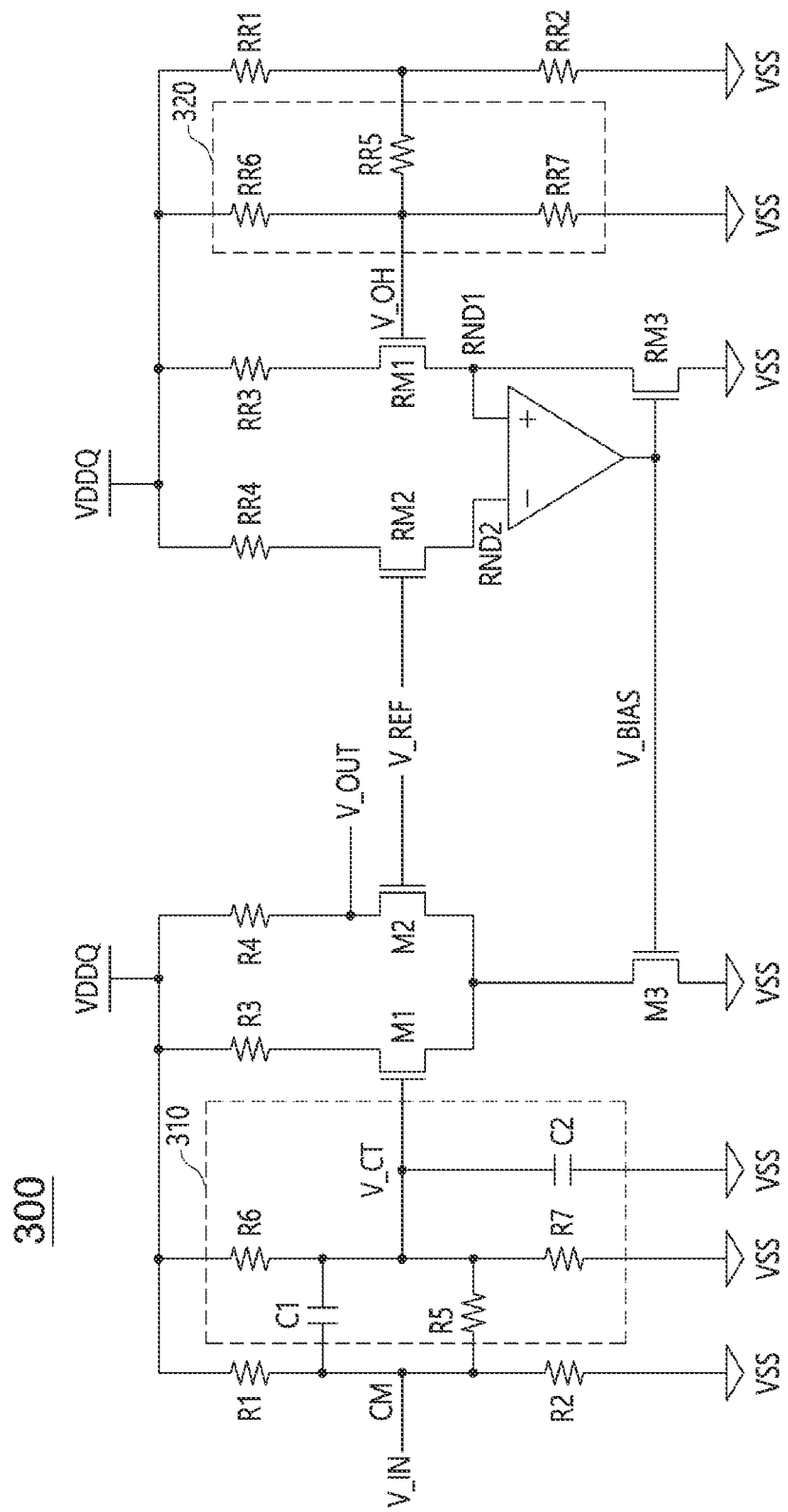
FIG. 3 is a circuit diagram illustrating an input buffer circuit in accordance with an embodiment.

FIG. 3 is a circuit diagram illustrating an input buffer circuit in accordance with an embodiment.

Referring to FIG. 3, an input buffer circuit 300 may further include a signal attenuation circuit 310 and an attenuation modeling circuit 320 compared to the input buffer circuit 200 in FIG. 2, Thus, in FIGS. 2 and 3, the same reference numerals may refer to the same elements. For convenience of description, the signal attenuation circuit 310 and the attenuation modeling circuit 320 may be illustrated herein.

The signal attenuation circuit 310 may attenuate an operation voltage range of at least one of a high frequency component and a low frequency component in the input signal V_IN. The operation voltage range may be a range between a maximum voltage value and a minimum voltage value of an attenuation signal V_CT.

The signal attenuation circuit 310 may include first and second capacitors C1 and C2 and fifth to seventh resistances R5, R6, and R7, The first capacitor C1 and the fifth resistance R5 may be parallely connected between a commode node CM configured to receive the input signal V_IN and a node configured to output the attenuation signal V_CT. The sixth resistance R6 may be connected between the supply power voltage terminal VDDQ and the node configured to output the attenuation signal V_CT. The seventh resistance R7 and the second capacitor C2 may be parallely connected between the node configured to output the attenuation signal V_CT and the ground power voltage terminal VSS.

Figure 4:
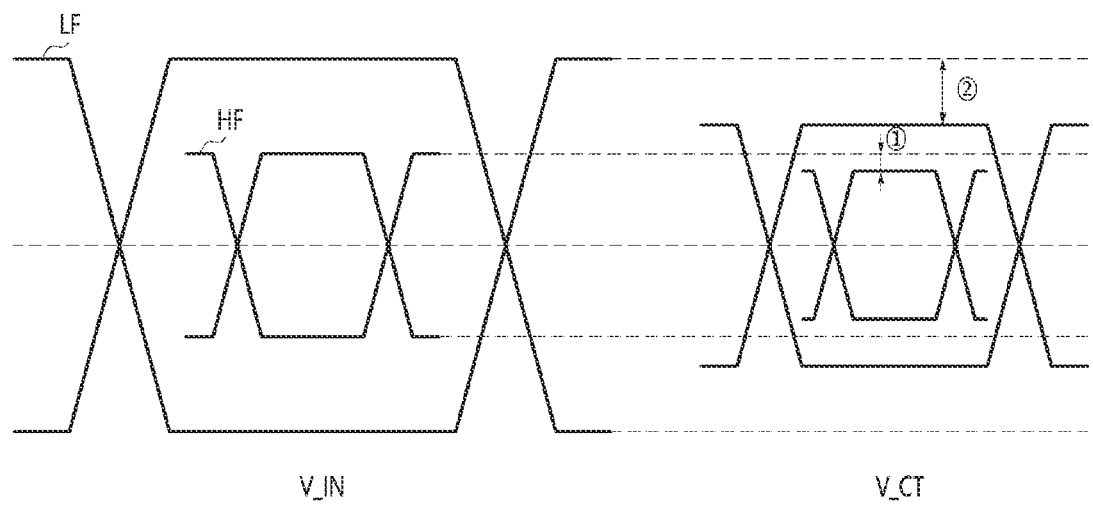
FIG. 4 is a view illustrating a function of a signal attenuation circuit in FIG. 3.

FIG. 4 is a view illustrating a function of a signal attenuation circuit in FIG. 3. FIG. 4 shows the input signal V_IN inputted into the signal attenuation circuit 310 and the attenuation signal V_CT outputted from the signal attenuation circuit 310.

Referring to FIGS. 3 and 4, the input signal V_IN inputted into the input buffer circuit 300 may include the high frequency component HF or the low frequency component LF, The signal attenuation circuit 310 may attenuate the operation voltage range of the high frequency component HF or the low frequency component LF of the input signal V_IN to generate the attenuation signal V_CT. The operation voltage range corresponding to the range between the maximum voltage value and the minimum voltage value of the input signal V_IN may be converted into the attenuation signal V_CT to attenuate the operation voltage range of the high and low frequency components in the input signal V_IN.

An attenuation rate of the high frequency component HF in the input signal V_IN may be indicated by ①. An attenuation rate of the low frequency component LF in the input signal V_IN may be indicated by ②. As shown in FIG. 4, the attenuation rate corresponding to the high frequency component HF may be different from the attenuation rate ② corresponding to the low frequency component, That is, the signal attenuation circuit 310 may control to provide the high frequency component HF and the low frequency component LF in the input signal V_IN with the different attenuation rates ① and ②.

Particularly, the signal attenuation circuit 310 may control to provide the high frequency component HF and the low frequency component LF in the input signal V_IN with the attenuation rate ① lower than the attenuation rate ②. Because the low attenuation rate ① corresponding to the high frequency component HF may correspond to a low loss of the input signal V_IN, the first NMOS transistor M1 may accurately receive the attenuation signal V_CT corresponding to the input signal V_IN. The high attenuation rate ② corresponding to the low frequency component LF may allow the signal attenuation circuit 310 to generate the attenuation signal V_CT without a turn-off region of the first NMOS transistor M1. Thus, the first NMOS transistor M1 may stably perform the input operation through the attenuation signal V_CT.

Referring to FIG. 3, the attenuation modeling circuit 320 may be formed by modeling the signal attenuation circuit 310. The attenuation modeling circuit 320 may include fifth to seventh modeling resistances RR5, RR6, and RR7.

The fifth modeling resistance RR5 may be connected between the common node of the first and second modeling resistances RR1 and RR2 and a node at which the gate voltage V_OH may be formed. The sixth and seventh modeling resistances RR6 and RR7 may be serially connected between the supply power voltage terminal VDDQ and the ground power voltage terminal VSS. The fifth to seventh modeling resistances RR5, RR6, and RR7 may be formed by modeling the corresponding fifth to seventh resistances R5, R6 and R7 of the signal attenuation circuit 310.

Thus, the input buffer circuit 300 in FIG. 3 may be set to generate the output signal V_OUT having the linear characteristic with respect to the input signal V_IN through the attenuation modeling circuit 320 similarly to the input buffer circuit 200 in FIG. 2. Further, the input buffer circuit 300 may stably secure the linear characteristic of the input signal V_IN through the signal attenuation circuit 310. As a result, the input buffer circuit 300 may stably generate the output signal V_OUT having the linear characteristics.

The seventh resistance R7 of the signal attenuation circuit 310 may include a variable resistance. When a resistance value of the seventh variable resistance R7 is changed, the operation voltage range of the attenuation signal V_CT may also be changed, That is, the signal attenuation circuit 310 may perform a level shifting operation with respect to the operation voltage range of the attenuation signal V_CT, i.e., the maximum voltage value and the minimum voltage value of the attenuation signal V_CT by controlling the resistance value. The seventh modeling resistance RR7 of the attenuation modeling circuit 320 may be formed by modeling a resistance value corresponding to the resistance value of the seventh resistance R7.

Figure 5:
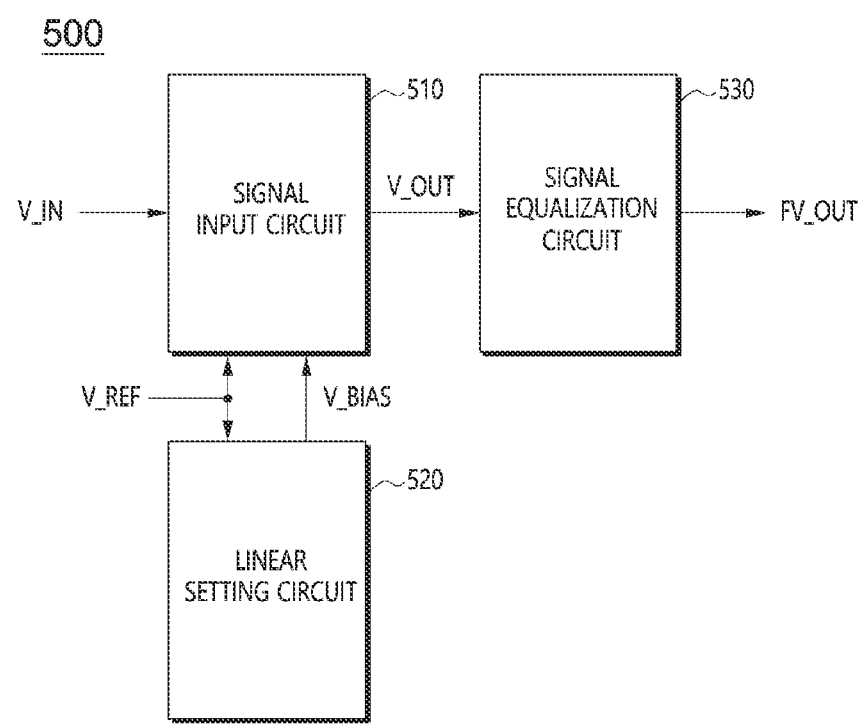
FIG. 5 is a block diagram illustrating an input buffer circuit in accordance with an embodiment.

FIG. 5 is a block diagram illustrating an input buffer circuit in accordance with an embodiment.

Referring to FIG. 5, an input buffer circuit 500 may include a signal input circuit 510, a linear setting circuit 520, and an equalization circuit 530.

The signal input circuit 510 may receive the input signal V_IN to generate the output signal V_OUT based on the reference voltage V_REF and the activation current. The signal input circuit 510 may have a configuration corresponding to the configuration of the signal input circuit 110 in FIG. 1.

The linear setting circuit 520 may compare the voltage of the first modeling node corresponding to the input signal V_IN with the voltage of the second modeling node corresponding to the reference voltage V_REF to generate the bias voltage V_BIAS. The linear setting circuit 520 may have a configuration corresponding to the configuration of the linear setting circuit 120 in FIG. 1.

The equalization circuit 530 may receive the output signal V_OUT from the signal input circuit 510 to perform an equalization operation, thereby outputting a final output signal FV_OUT, The equalization circuit 530 may include a decision feedback equalization (DFE) circuit.

As indicated above, the signal input circuit 510 may perform the setting operation for the linear characteristic based on the bias voltage V_BIAS generated from the linear setting circuit 520. Thus, the output signal V_OUT of the signal input circuit 510 may have the linear characteristics. The equalization circuit 530 may receive the output signal V_OUT having the linear characteristic to perform the stable equalization operation. Thus, the equalization circuit 530 may generate the improved output signal FV_OUT corresponding to the input signal V_IN. The final output signal FV_OUT may be provided to various internal circuits arranged at next stage.

Figure 6:
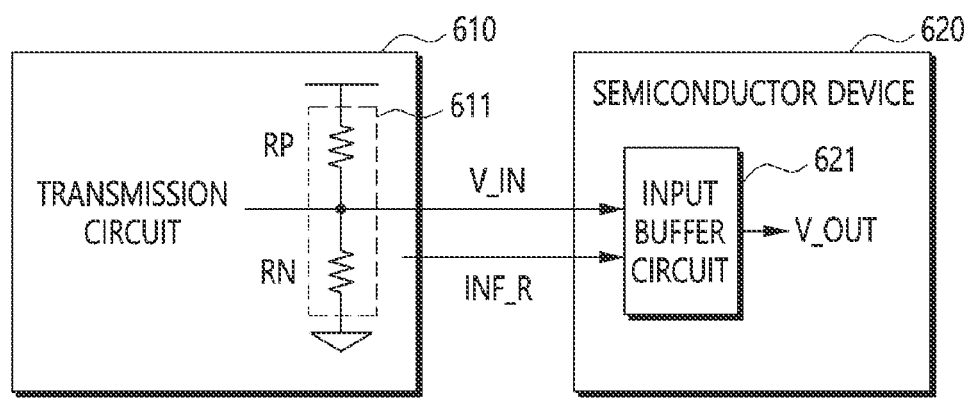
FIG. 6 is a block diagram illustrating a semiconductor system in accordance with an embodiment.

FIG. 6 is a block diagram illustrating a semiconductor system in accordance with an embodiment.

Referring to FIG. 6, a semiconductor system 600 may include a transmission circuit 610 and a semiconductor device 620, The semiconductor device 620 may be operated by receiving the input signal V_IN from the transmission circuit 610.

The transmission circuit 610 may provide the input signal V_IN on which an on-resistance value may be reflected and on-resistance information INF_R corresponding to the on-resistance value. The transmission circuit 610 may include an on-resistance circuit 611 for an impedance matching in transmitting the input signal V_IN. The on-resistance circuit 611 may include a pull-up on-resistance RP and a pull-down on-resistance RN. The pull-up on-resistance RP and the pull-down on-resistance RN may have different on-resistance values.

The semiconductor device 620 may include an input buffer circuit 621. The input buffer circuit 621 may be the input buffer circuits illustrated with reference to FIGS. 1 to 5. Thus, any further illustrations with respect to the input buffer circuit 621 may be omitted herein for brevity. The input buffer circuit 621 may use the on-resistance information INF_R for setting the bias voltage in FIG. 7.

Figure 7:
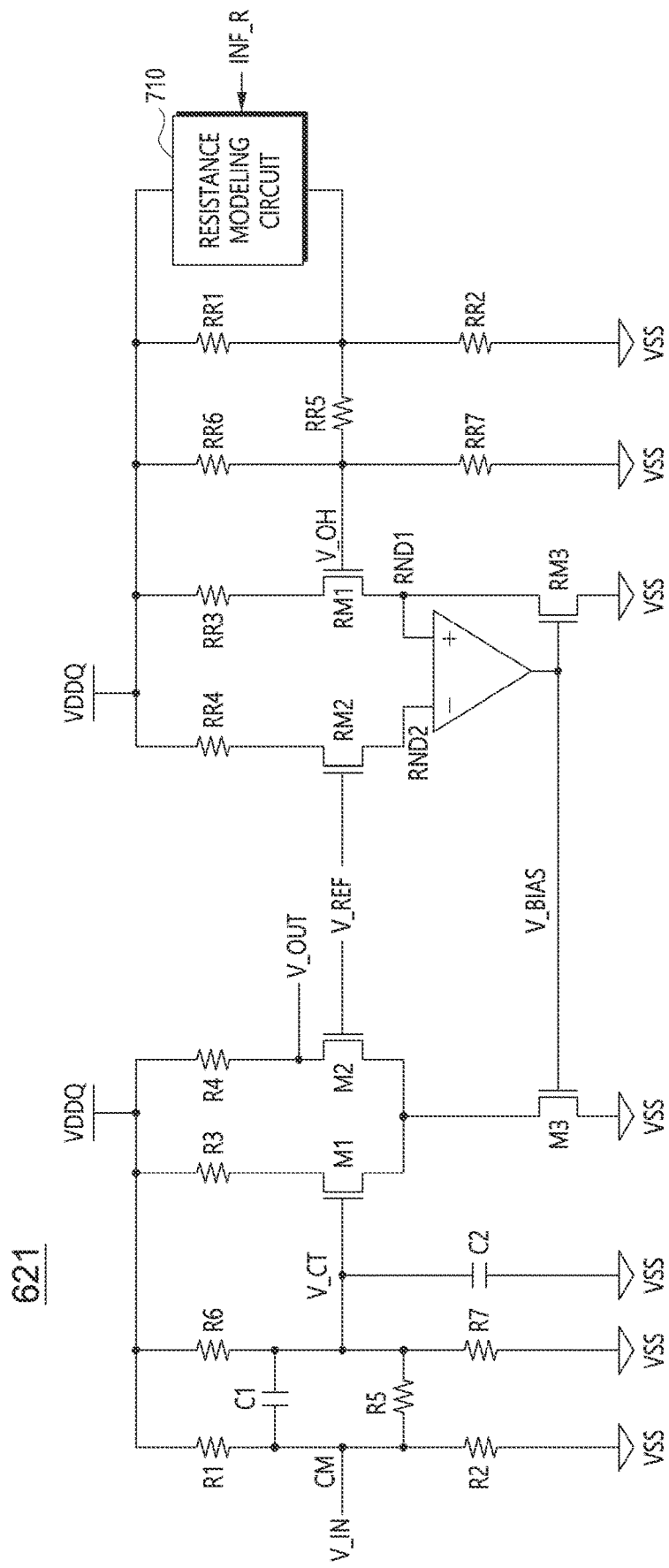
FIG. 7 is a circuit diagram illustrating an input buffer circuit in FIG. 6.

FIG. 7 is a circuit diagram illustrating an input buffer circuit in FIG. 6.

Referring to FIGS. 6 and 7, the input buffer circuit 621 may further include a resistance modeling circuit 710 compared to the input buffer circuit 300 in FIG. 3. Thus, the same reference numerals in FIGS. 3 and 7 may refer to the same elements.

The resistance modeling circuit 710 may be connected to the input modeling circuit in FIG. 3. The resistance modeling circuit 710 may be formed by modeling the on-resistance circuit 611 of the transmission circuit 610, A resistance value of the resistance modeling circuit 710 may be controlled based on the on-resistance information INF_R. The gate voltage V_OH may reflect the resistance value corresponding to the on-resistance information INF_R to control the bias voltage V_BIAS. As a result, the bias voltage V_BIAS may reflect the on-resistance value corresponding to the on-resistance circuit 611. When the on-resistance value is reflected on the bias voltage V_BIAS, the input buffer circuit 621 may generate the output signal V_OUT having the stable linear characteristic.

FIG. 7 may represent a configuration corresponding to the pull-up on-resistance RP among the on-resistance circuit 611, When the pull-down on-resistance RN is applied, the third modeling NMOS transistor RM3 may be connected to the second modeling node RND2, not the first modeling node RND1.

According to an embodiment, the semiconductor system 600 may model the on-resistance circuit 611 of the transmission circuit 610 and reflect the modeled circuit on the bias voltage V_BIAS provide the input buffer circuit 621 with an optimal environment capable of generating the output signal V_-OUT having the linear characteristic.

In an embodiment, the resistance modeling circuit 710 in FIG. 7 may have the set resistance value based on the on-resistance information INF_R, but is not limited thereto. For example, although the resistance modeling circuit 710 might not receive the on-resistance information INF_R, the resistance modeling circuit 710 may model as a predetermined on-resistance model by a spec.

The above described embodiments of the present disclosure are intended to illustrate and not to limit the present teachings, Various alternatives and equivalents are possible. The present teachings are not limited by the embodiments described herein. Nor are the present teachings limited to any specific type of semiconductor device, Other additions, subtractions, and/or modifications are possible in view of the present disclosure and are intended to fall within the scope of the appended claims.

What is claimed is:

1. An input buffer circuit comprising:
 a signal input circuit configured to receive an input signal to generate an output signal based on a reference voltage and an activation current; and
 a linear setting circuit configured to compare a voltage of a first modeling node, which corresponds to the input signal, with a voltage of a second modeling node, which corresponds to the reference voltage, to generate a bias voltage for controlling the activation current.

2. The input buffer circuit of claim 1, wherein the linear setting circuit comprises:
 an input modeling circuit including the first and second modeling nodes, the input modeling circuit configured to model the signal input circuit; and
 a comparison circuit configured to compare the voltages of the first and second modeling nodes with each other to generate the bias voltage.

3. The input buffer circuit of claim 1, further comprising a signal attenuation circuit configured to attenuate an operation voltage range with respect to at least one of a high frequency component and a low frequency component in the input signal.

4. The input buffer circuit of claim 3, wherein the signal attenuation circuit is configured to control to provide the high frequency component and the low frequency component in the input signal with different attenuation rates.

5. The input buffer circuit of claim 3, wherein the linear setting circuit further comprises an attenuation modeling circuit formed by modeling the signal attenuation circuit.

6. The input buffer circuit of claim 5, wherein the signal attenuation circuit is configured to level-shift the operation voltage range in accordance with an internal resistance value and the attenuation modeling circuit is configured to model the internal resistance value.

7. The input buffer circuit of claim 1, further comprising an equalization circuit configured to receive the output signal to perform an equalization operation and generate a final output signal.

8. The input buffer circuit of claim 1, wherein the linear setting circuit further comprises a resistance modeling circuit formed by modeling a predetermined on-resistance value.

9. A semiconductor system comprising:
 a transmission circuit configured to provide an input signal reflecting an on-resistance value and on-resistance information corresponding to the on-resistance value; and
 an input buffer circuit including a signal input circuit and a linear setting circuit, the signal input circuit configured to receive the input signal to generate an output signal based on a reference voltage and an activation current, and the linear setting circuit configured to compare a voltage of a first modeling node, which corresponds to the input signal, with a voltage of a second modeling node, which corresponds to the reference voltage, to generate a bias voltage for controlling the activation current.

10. The semiconductor system of claim 9, wherein the linear setting circuit comprises:
 an input modeling circuit including the first and second modeling nodes, the input modeling circuit configured to model the signal input circuit;
 a resistance modeling circuit connected with the input modeling circuit and formed by modeling the on-resistance value of the transmission circuit; and
 a comparison circuit configured to compare the voltages of the first and second modeling nodes with each other to generate the bias voltage.

11. The semiconductor system of claim 10, wherein a resistance value of the resistance modeling circuit is controlled based on the on-resistance information.

12. The semiconductor system of claim 9, further comprising a signal attenuation circuit configured to attenuate an operation voltage range with respect to at least one of a high frequency component and a low frequency component in the input signal.

13. The semiconductor system of claim 12, wherein the signal attenuation circuit is configured to control to provide the high frequency component and the low frequency component in the input signal with different attenuation rates.

14. The semiconductor system of claim 12, wherein the linear setting circuit further comprises an attenuation modeling circuit formed by modeling the signal attenuation circuit.

15. The semiconductor system of claim 14, wherein the signal attenuation circuit is configured to level-shift the operation voltage range in accordance with an internal resistance value and the attenuation modeling circuit is configured to model the internal resistance value.

16. The semiconductor system of claim 9, further comprising an equalization circuit configured to receive the output signal to perform an equalization operation and generate a final output signal.

* * * * *